United States Patent [19]

Nutz et al.

[11] Patent Number: 5,331,270
[45] Date of Patent: Jul. 19, 1994

[54] CIRCUIT ARRAY FOR LIMITING A LOAD CURRENT BY REVERSE PHASE ANGLE CONTROL

[75] Inventors: Karl-Diether Nutz, Oedheim; Berthold Gruber, Bad Rappenau, both of Fed. Rep. of Germany

[73] Assignee: Temic Telefunken microelectronic GmbH, Heilbronn, Fed. Rep. of Germany

[21] Appl. No.: 29,237

[22] Filed: Mar. 10, 1993

[30] Foreign Application Priority Data

Apr. 2, 1992 [DE] Fed. Rep. of Germany ....... 4210993

[51] Int. Cl.$^5$ .............................................. G05F 1/44
[52] U.S. Cl. .................................. 323/237; 323/235; 323/242; 323/244
[58] Field of Search ............... 323/237, 241, 242, 243, 323/244, 300, 320, 322, 325, 326

[56] References Cited

U.S. PATENT DOCUMENTS

| | | | |
|---|---|---|---|
| 4,158,164 | 6/1979 | Nutz | 323/243 |
| 4,507,569 | 3/1985 | Hess | 307/130 |
| 4,528,494 | 7/1985 | Bloomer | 323/237 |
| 4,567,425 | 1/1986 | Bloomer | 323/237 |

FOREIGN PATENT DOCUMENTS

| | | |
|---|---|---|
| 0200827 | 11/1986 | European Pat. Off. . |
| 0301815 | 2/1989 | European Pat. Off. . |
| 0311995 | 4/1989 | European Pat. Off. . |
| 0367984 | 5/1990 | European Pat. Off. . |
| 0380833 | 8/1990 | European Pat. Off. . |
| 0401587A3 | 12/1990 | European Pat. Off. . |
| 2073510 | 10/1981 | United Kingdom . |
| 2100481 | 12/1982 | United Kingdom . |
| 2200006 | 7/1988 | United Kingdom . |

OTHER PUBLICATIONS

"Technische Rundschau" (Technical Review), vol. 66, No. 34, Jan. 01, 1974, Bern, CH, p. 25; Karl-D. Nutz Ein monolithisch integrierter Nullspannungsschalter (A monolithically integrated zero voltage switch).

Primary Examiner—Steven L. Stephan
Assistant Examiner—Y. Jessica Han
Attorney, Agent, or Firm—Spencer, Frank & Schneider

[57] ABSTRACT

A circuit array, adapted to be coupled to a load and a source of a main AC voltage, for reverse phase angle control whereby a current flow in the load is limited to a defined phase angle ($\alpha$) of the main AC voltage, comprising the following components for sequential control of the reverse phase angle control: a switching element, connected to the load and coupled to the source of the main AC voltage, for actuating the current flow in the load; a time determining component; and an integrated circuit. The integrated circuit includes: an actuating circuit, connected to the time determining component, responsive to a first control signal for generating a ramp voltage, and responsive to a second control signal for selecting one of at least two predetermined temporal voltage curves for the ramp voltage; a synchronizing circuit, coupled to the source of the main AC voltage and connected to the actuating circuit, for detecting a zero crossing of the main AC voltage, for synchronizing the ramp voltage to the main AC voltage, and for generating the first control signal; an evaluation circuit, connected to the actuating circuit and the synchronizing circuit, for monitoring the ramp voltage during reverse phase angle control and for generating the second control signal and a third control signal; an output stage, connected between the evaluation circuit and the switching element, and responsive to the third control signal for controlling the switching element; and a voltage supply circuit.

19 Claims, 2 Drawing Sheets

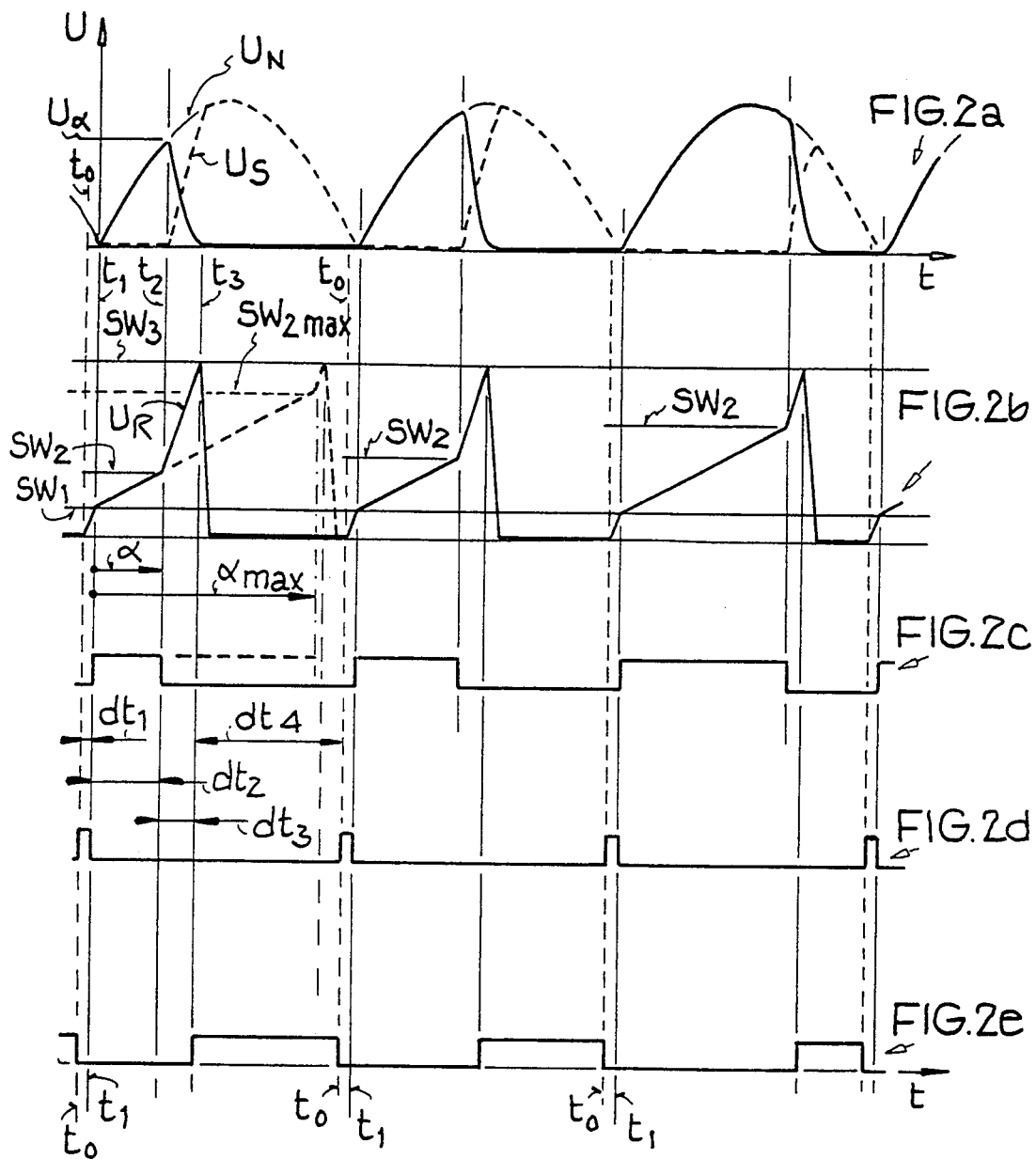

CIRCUIT ARRAY FOR LIMITING A LOAD CURRENT BY REVERSE PHASE ANGLE CONTROL

BACKGROUND OF THE INVENTION

To control the power supply to a load with defined timing, the load current through the load is usually, in the case of so-called phase angle control, switched on with the aid of thyristors or triacs only at a certain phase angle after a zero crossing of the main AC voltage by a control pulse, and switches off again by itself at the next zero crossing. A drawback of the phase angle the control is the low power factor, since even with ohmic .load a certain reactive power component—and a high one case of large phase angles—is always present. In addition, there is often a holding current problem in phase angle control, since inadvertent switch-off of the semiconductor switch—particularly at low load crrents—has to be prevented. Finally, a high degree of interference suppression is necessary in phase angle control on account of the sudden voltage decrease occurring at load current switch-on time, and of the HF problems this entails.

Unlike in phase angle control, the power supply to the load in reverse phase angle control is controlled with the aid of semiconductor switches, that can be fully switched off, and are preferably field-effect transistors, such that the load current is switched on in the zero crossing of the main AC voltage and switched off again at a certain phase angle (when the current set is reached). Since this minimizes the reactive power component, the active power component is at a maximum and an optimum efficiency is thereby obtained; since no sudden voltage decrease occurs when the load current is switched on and the switch-off edge of the curve can have a controlled course, no interference suppression measures are needed.

SUMMARY OF THE INVENTION

The object underlying the present invention is to provide a circuit array for reverse phase angle control whereby reverse phase angle control can be achieved using a very small number of components.

This object is attained, according to an embodiment of the invention, by a circuit array, adapted to be coupled to a load and a source of a main AC voltage, for reverse phase angle control whereby a current flow in the load is limited to a defined phase angle ($\alpha$) of the main AC voltage, comprising the following components for sequential control of the reverse phase angle control: a switching element, connected to the load and coupled to the source of the main AC voltage, for actuating the current flow in the load; a time determining component; and an integrated circuit including: an actuating circuit, connected to the time determining component, responsive to a first control signal for generating a ramp voltage, and responsive to a second control signal for selecting one of at least two predetermined temporal voltage curves for the ramp voltage; a synchronizing circuit, coupled to the source of the main AC voltage and connected to the actuating circuit, for detecting a zero crossing of the main AC voltage, for synchronizing the ramp voltage to the main AC voltage, and for generating the first control signal; an evaluation circuit, connected to the actuating circuit and the synchronizing circuit, for monitoring the ramp voltage during reverse phase angle control and for generating the second control signal and a third control signal; an output stage, connected between the evaluation circuit and the switching element, and responsive to the third control signal for controlling the switching element; and a voltage supply circuit coupled to the source of the main AC voltage and connected to the synchronizing circuit.

It must be ensured by the circuit array for reverse phase angle control that the load current is, on the one hand, switched on by the semiconductor switch precisely in the zero crossing of the main voltage, and on the other hand, switched off with a defined edge after the externally presettable current flow time (the reverse phase angle time interval). For controlling the timing of switching on and switching off of the load current, a single time-determining component is advantageously used in the present circuit array; actuation of the time-determining component and evaluation of the time diagrams is implemented by switching components of an integrated circuit—actuation by a synchronizing circuit and actuating circuit, for example, and evaluation by an evaluating circuit, for example.

The time-determining component is preferably a capacitor integrated into the circuit or externally connected, by the charge state of which a ramp voltage is generated; the charge state of the capacitor, and hence the time characteristics of the ramp voltage, is controlled by, for example, a switchable current generator, and the time diagram evaluated by, for example, comparators.

BRIEF DESCRIPTION OF THE DRAWINGS

The circuit array for reverse phase angle control is described in detail in the following on the basis of FIG. 1 shows an integrated circuit, according to an embodiment of the invention, with external components, and show various timing diagrams.

DESCRIPTION OF THE PREFERRED EMBODIMENTS

Figure 1:
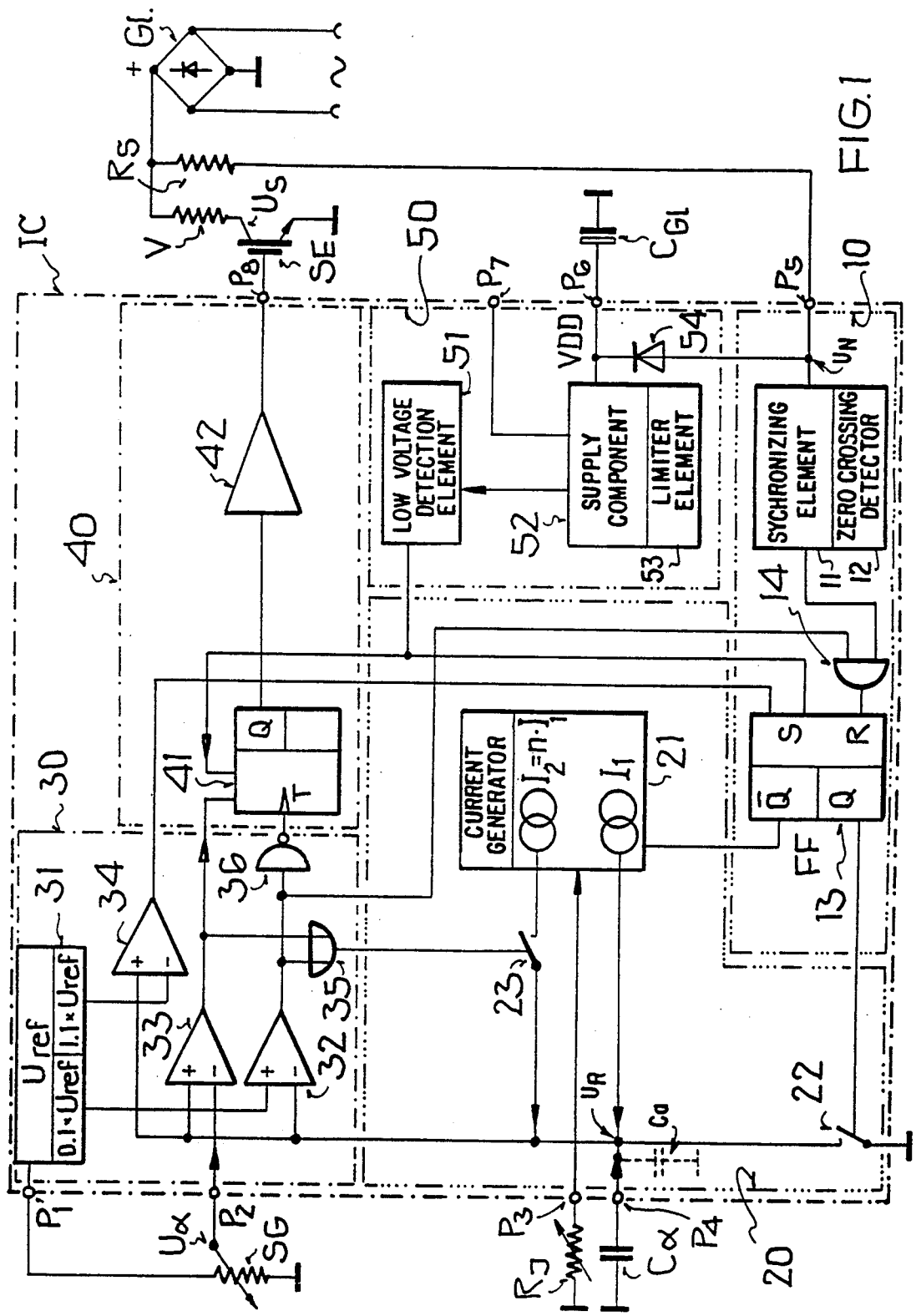

FIG. 1 shows the following components:
- the integrated circuit IC with the 8 connection pins P-P ($P_1$: reference voltage output; $P_2$: control input; $P_3$: adjustment input; $P_4$: control output/ramp input; $P_5$: synchronizlng/supply input; $P_6$: capacitor output; $P_7$: reference potential; $P_8$; actuating output) and the circuit array components synchronizing circuit 10, actuating circuit 20, evaluation circuit 30, output stage 40 and voltage supply circuit 50
- the switching element SE connected to the actuating output $P_8$ of the integrated circuit IC and controlling the current flow through the load V to be supplied with load current; the switching element SE can be, for example, a bipolar transistor or a MOS field-effect transistor—preferably however an insulated gate bipolar transistor (IGBT) is used as the switching element SE (voltage $U_S$), since this transistor is actuated virtually without power by control voltages and can be shut off in a defined manner
- the setting element SG connected to the reference voltage output $P_1$ and the control input $P_2$ (for example a potentiometer), that presets a control voltage $U_\alpha$ determining the phase angle $\alpha$ and hence the current flow duration: the control voltage $U_\alpha$ can be varied externally by the setting element SG between a minimum voltage $U_{\alpha,min}$ and a maximum voltage $U_{\alpha,max}$

- the resistor $R_J$ connected to the adjustment input $P_3$, by which a precise current reference for the actuating circuit 20 is set
- the capacitor C connected to the control output or ramp input $P_4$ externally or internally (the internal connection of $C_\alpha$ is shown with a dashed line in FIG. 1) as the time-determining component, by which (due to the ramp voltage $U_R$ applied to the capacitor $C_\alpha$) the time diagrams of the reverse phase angle control can be controlled; thanks to the advantageous actuation of the capacitor $C_\alpha$ by switching components of the integrated circuit, it is possible to precisely record and evaluate different timings with the capacitor $C_\alpha$ as the sole time-determining element
- the capacitor $C_{GL}$ connected to the capacitor output $P_6$ for smoothing the supply voltage
- the rectifier G1 for rectification of the main AC voltage and the synchronizing resistor $R_S$ connected to the synchronizing input $P_5$ The integrated circuit IC comprises the following switching components
- The synchronizing circuit 10 with the synchronizing element 11, with the zero crossing detector 12, with the latch 13 (for example an RS flip-flop), and with the AND gate 14; zero crossing detection of the rectified main AC voltage $U_N$ and synchronization of the ramp voltage $U_R$ with the rectified main AC voltage $U_N$ is performed by the synchronizing circuit 10.
- The actuating circuit 20 with the current generator 21 activated/deactivated by the latch 13 and adjusted using the adjustment input $P_3$, via the current output generator of which generator the ramp voltage $U_R$ is by charging the capacitor $C_\alpha$, with the first switch 22 for activation/deactivation of the timer element $C_\alpha$, and with the second switch 23 for changing the range of the current generator 21 from current $I_1$ to the substantially greater current $I_1 + I_2$ ($I_2 = n \times I_1$, $n > 1$); using the actuating circuit 20 it is therefore possible, by generating ramp voltages $U_R$ of varying steepness at the capacitor $C_\alpha$, to set/preset different time diagrams.

The evaluation circuit 30 with the reference voltage generator 31 connected to the reference voltage output $P_1$ and generating the reference voltage $U_{Ref}$; the comparators 32, 33, 34 for setting the threshold values $SW_1$, $SW_2$, $SW_3$, respectively, and the logic gates 35, 36 for processing the signals at the comparator outputs; the voltage levels (particularly the ramp voltages) occurring with reverse phase angle control are monitored by the 30 and compared with the threshold values $SW_1$, $SW_2$, $SW_3$, and certain reactions are triggered depending on this comparison.

The output stage output 40 with the toggle flip-flop 41 actuated by the evaluation circuit 30 and the output amplifier 42 connected to the toggle flip-flop 41; the output of this amplifier is connected to the actuating output $P_8$ and, therefore, to the switching element SE.
- The voltage supply circuit 50 with the low voltage detection element 51 ("Power On"), the supply component 52, the limiter element 53 and the limiter diode 54.

The timing of reverse phase angle control and its sequential control is explained using the timing diagrams shown in FIG. 2. FIG. 2a shows the curve of the rectified main AC voltage $U_N$ and the voltage $U_S$ at the switching element SE, FIG. 2b shows the curve of the ramp voltage $U_R$ generated by the output current of the current generator 21, and FIGS. 2c, 2d and 2e show the logic levels at the circuit output $P_8$, at the zero crossing detector 12 and at the output of the synchronizing element 11, respectively. Each half-wave of the rectified main AC voltage $U_N$ is divided into four characteristic time intervals as shown in FIG. 2:
- The time interval $dt_1$ from the time $t_0$ (zero crossing detection) to time $t_1$ (actual zero crossing) is the "compensation time interval" for compensation of the time difference between detection and occurrence of the zero crossing of the rectified main AC voltage $U_N$.

The zero crossing detector 12 generates (FIG. 2d) at the time $t_0$, just before the zero crossing of the main AC voltage $U_N$, a pulse (logic "1") by which a reset of the latch 13 is generated via the AND gate 14. The output Q of the latch 13 is switched to "0" and the first switch 22 opened; at the same time, the output $\overline{Q}$ of the latch 13 is switched to "1" as a result of which the current generator 21 is activated. The output signal of the first comparator 32 (logic "1" if the ramp voltage $U_R$ as per FIG. 2b is less than the threshold value $SW_1$) closes the second switch 23 via the OR gate 35 and changes the range of the current generator 21; the latter charges the capacitor $C_\alpha$ with the sum current $I = I_1 + I_2 = (n+1) \times I_1$ and therefore generates a steep rise in the ramp voltage $U_R$. The length of the compensation time interval $dt_1$ is determined by the two input voltages at the first comparator 32—threshold value $SW_1$ and ramp voltage $U_R$; the threshold value $SW_1$ of the first comparator 32 is far below the reference voltage $U_{Ref}$ preset by the reference voltage generator 31 (for example $SW_1 = 0.1 \times U_{Ref}$, i.e. $SW_1 = 0.5$ V at a reference voltage $U_{Ref} = 5$ V) and is therefore attained quickly with the steep voltage increase of the ramp voltage $U_R$.
- The time interval $dt_2$ from the time $t_1$ (end of compensation time interval $dt_1$) to time $t_2$ (the ramp voltage $U_R$ at capacitor $C_\alpha$ reaches the control voltage $U_\alpha$ set at the Control input $P_2$) is the reverse phase angle time interval in which the load current for the load is flowing (FIG. 2c).

At the time $t_1$, the ramp voltage $U_R$ reaches the threshold value $SW_1$ of the first comparator 32 (FIG. 2b), as a result of which the output of first comparator 32 is switched from logic "1" to logic "0" the one hand this opens the second switch 23 via the OR gate 35 and switches the current generator 21 to the low output current $I_1$, so that a shallow voltage increase in the ramp voltage $U_R$ is preset for the second comparator 33; on the other hand, the toggle flip-flop 41 and the amplifier stage 42 of the power semiconductor switch SE are activated (IGBT transistor is switched through) via the inverter 36 (output = "1"), so that the load current starts to flow through the load V. At the time $t_2$, the ramp voltage $U_R$ reaches the comparator threshold value $SW_2$ preset using the control voltage $U_\alpha$ (FIG. 2b); the output of the second comparator (33) is switched from logic "0" to logic "1" and the power semiconductor switch SE is deactivated (the IGBT transistor is blocked) via the toggle flip-flop 41 and the amplifier 42; at the same time, the second switch 23 is closed at the time $t_2$ via the OR gate 35, and therefore the current generator 21 is changed over to the sum current $I = I_1 + I_2$.

The length of the reverse phase angle time interval $dt_2$ is preset by the two input voltages of the second comparator 33—the control voltage $U_\alpha$ determining the level of the second threshold value $SW_2$ on the one hand and the ramp voltage on the other hand. The minimum reverse phase angle $\alpha_{min}$ corresponds to the minimum control voltage $U_{\alpha,min}=SW_1$ (threshold value of first comparator 32), and the maximum reverse phase angle $\alpha_{max}$ to the maximum control voltage $U_{\alpha,max}=U_{Ref}$, which presets the maximum possible second threshold value $SW_{2,max}$ (the maximum values are shown as dashed lines in FIGS. 2b and 2c).

- The time interval $dt_3$ from time $t_2$ to time $t_3$ is a "safety time interval" when the load current is switched off; in the time interval $dt_2$ the output stage 40 is dependably deactivated by the reset pulse of the flip-flop 41, in order to prevent any effect by the switching-off operation of the switching element SE (due to the increasing voltage) on the circuit array. The current generator 21 switched over to the sum current $I_1+I_2$ at time $t_2$ is deactivated at time $t_3$ via the latch 13 when the third comparator threshold value $SW_3$ is reached (output of third comparator 34 is logic "0") the same time the capacitor $C_\alpha$ is short-circuited via the first switch 22.

The length of the safety time interval $dt_3$ is determined by the two input voltages at the third comparator 34—threshold value $SW_3$ and (steep) ramp voltage $U_R$; the threshold value $SW_3$ is slightly above the reference voltage $U_{Ref}$ value preset by the reference generator 31, for example $SW_3=1.1\times U_{Ref}$, and is therefore quickly attained with the steep voltage increase in the ramp voltage $U_R$.

Simultaneously, the synchronizing circuit 10 is deactivated using the output of the second comparator 33 and the AND gate 14 in order to suppress the interference pulses at time $t_2$, and enabling of zero synchronization is blocked (FIG. 2e); in accordance with FIG. 2e, the output of the synchronizing element 11 remains at logic "1" and the synchronizing circuit 10 is therefore deactivated until the ramp voltage $U_R$ has fallen back below the threshold value $SW_1$ of the first comparator 32.

- In the time interval $dt_4$ from the time $t_3$ to time $t_0$, the next period of the half-wave of the main rectified AC voltage $U_N$ is prepared; the capacitor $C_\alpha$ is completely discharged with the first switch 22 closed, and thereby initialized for the next reverse phase angle—for example as shown in FIG. 2 with a different phase angle $\alpha$.

What is claimed is:

1. A circuit array, adapted to be coupled to a load and a source of a main AC voltage, for reverse phase angle control whereby a current flow in the load is limited to a defined phase angle ($\alpha$) of the main AC voltage, comprising the following components, for sequential control of the reverse phase angle control;

a switching element, connected to the load and coupled to the source of the main AC voltage, for actuating the current flow in the load;

a time determining component; and an integrated circuit including:

an actuating circuit, connected to said time determining component, responsive to a first control signal for generating a ramp voltage, and responsive to a second control signal for selecting one of at least two predetermined temporal voltage curves for the ramp voltage;

a synchronizing circuit, coupled to the source of the main AC voltage and connected to said actuating circuit, for detecting a zero crossing of the main AC voltage, for synchronizing the ramp voltage to the main AC voltage, and for generating the first control signal;

an evaluation circuit, connected to the actuating circuit and the synchronizing circuit, for monitoring the ramp voltage during reverse phase angle control and for generating the second control signal and a third control signal;

an output stage, connected between said evaluation circuit and the switching element, and responsive to the third control signal for controlling said switching element; and a voltage supply circuit coupled to the source of the main AC voltage and connected to said synchronizing circuit.

2. A circuit array according to claim 1, wherein said time-determining component is a capacitor and the ramp voltage is generated by a charge state of said capacitor.

3. A circuit array according to claim 2, wherein said capacitor is disposed in said integrated circuit.

4. A circuit array according to claim 2, wherein said capacitor is connected externally to a connection pin, serving as a control output or ramp input, of said integrated circuit.

5. A circuit array according to claim 1, further comprising a setting element, connected between a control input and a reference voltage output of said integrated circuit, for generating a control voltage which determines said defined phase angle ($\alpha$).

6. A circuit array according to claim 1, further comprising a variable resistor connected externally to an adjusting input of said integrated circuit.

7. A circuit array according to claim 1, wherein said switching element is a semiconductor switching element and is connected to an actuating output of said integrated circuit.

8. A circuit array according to claim 7, wherein said semiconductor switching element is an insulated gate bipolar transistor.

9. A circuit array according to claim 1, wherein said synchronizing circuit includes a synchronizing element, a zero crossing detector, connected to said synchronizing element, an AND gate, connected to said synchronizing element, and a latch connected to said AND gate.

10. A circuit array according to claim 1, wherein said actuating circuit includes a current generator, a first switch, connected to said current generator, and a second switch, connected to said current generator and said first switch.

11. A circuit array according to claim 10, wherein an output of said current generator is switchably connected to said time determining component via said second switch.

12. A circuit array according to claim 11, wherein an output current of said current generator is switched, using said second switch, from a low output current ($I_1$) to a higher output current ($I_1+I_2$).

13. A circuit array according to claim 10, wherein an activation/deactivation input of said current generator is connected to an inverting output of said latch.

14. A circuit array according to claim 1, wherein said evaluation circuit includes a reference voltage generator, comparators with differing threshold values, coupled to said reference voltage generator, and two logic gates, connected to at least one of said comparators.

15. A circuit array according to claim 14, wherein a first input of each said comparator is connected to said time determining component for receiving the ramp voltage.

16. A circuit array according to claim 15, wherein second inputs of a first comparator and of a second comparator are connected to respective outputs of said reference voltage generator.

17. A circuit array according to claim 15, wherein a second input of a first comparator is connected to a control input of said integrated circuit for receiving a control voltage.

18. A circuit array according to claim 1, wherein said output stage includes a toggle flip-flop, connected to an actuated by said evaluation circuit, and an output amplifier connected to said toggle flip flop and an actuating output of said integrated circuit.

19. A circuit array according to claim 1, wherein said voltage supply circuit includes a low voltage detection element, a supply component, connected to said low voltage detection element, a limiter element, connected to said supply component, and a limiter diode connected to said supply component.

* * * * *